United States Patent
Kim et al.

(10) Patent No.: US 7,432,554 B2
(45) Date of Patent: Oct. 7, 2008

(54) CMOS THIN FILM TRANSISTOR COMPRISING COMMON GATE, LOGIC DEVICE COMPRISING THE CMOS THIN FILM TRANSISTOR, AND METHOD OF MANUFACTURING THE CMOS THIN FILM TRANSISTOR

(75) Inventors: Moon-Kyung Kim, Gyeonggi-do (KR);
Jo-Won Lee, Gyeonggi-do (KR);
Yoon-Dong Park, Gyeonggi-do (KR);
Chung-Woo Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 131 days.

(21) Appl. No.: 11/305,394

(22) Filed: Dec. 16, 2005

(65) Prior Publication Data

US 2006/0131653 A1 Jun. 22, 2006

(30) Foreign Application Priority Data

Dec. 16, 2004 (KR) ...................... 10-2004-0107159

(51) Int. Cl.
*H01L 27/08* (2006.01)
(52) U.S. Cl. ........................ 257/351; 257/204; 257/206; 257/369; 257/E27.046; 438/199
(58) Field of Classification Search .............. 257/204, 257/206, 351, 369, E27.046; 438/199
See application file for complete search history.

(56) References Cited

U.S. PATENT DOCUMENTS

| | | | | |
|---|---|---|---|---|
| 5,808,344 A * | 9/1998 | Ismail et al. | ................. | 257/369 |
| 5,866,445 A * | 2/1999 | Baumann | ..................... | 438/199 |
| 6,201,267 B1 * | 3/2001 | Gupta et al. | ................. | 257/206 |
| 6,635,517 B2 * | 10/2003 | Chen et al. | ................... | 438/143 |
| 6,683,362 B1 * | 1/2004 | O et al. | ........................ | 257/471 |
| 6,690,056 B1 * | 2/2004 | Reedy et al. | ........................ | 257/314 |
| 7,253,051 B2 * | 8/2007 | Ikeda et al. | ................. | 438/238 |

FOREIGN PATENT DOCUMENTS

CN 1433010 A 7/2003

\* cited by examiner

*Primary Examiner*—Evan Pert
*Assistant Examiner*—Victor A Mandala, Jr.
(74) *Attorney, Agent, or Firm*—Marger Johnson & McCollom, P.C.

(57) ABSTRACT

A complementary metal oxide semiconductor (CMOS) thin film transistor including a common gate, a logic device including the CMOS thin film transistor, and a method of manufacturing the CMOS thin film transistor are provided. In one embodiment, the CMOS thin film transistor includes a base substrate and a semiconductor layer formed on the base substrate. A PMOS transistor and an NMOS transistor are formed on a single semiconductor layer to intersect each other, and a common gate is formed on the intersection area. In addition, a Schottky barrier inducing material layer is formed on a source and a drain of the PMOS transistor.

26 Claims, 8 Drawing Sheets

CMOS THIN FILM TRANSISTOR COMPRISING COMMON GATE, LOGIC DEVICE COMPRISING THE CMOS THIN FILM TRANSISTOR, AND METHOD OF MANUFACTURING THE CMOS THIN FILM TRANSISTOR

CROSS-REFERENCE TO RELATED PATENT APPLICATIONS

This application claims the benefit of Korean Patent Application No. 10-2004-0107159, filed on Dec. 16, 2004, in the Korean Intellectual Property Office, the disclosure of which is incorporated herein in its entirety by reference.

BACKGROUND OF THE INVENTION

1. Field of the Invention

The present invention relates to a semiconductor device and a method of manufacturing the same, and more particularly, to a complementary metal oxide semiconductor (CMOS) transistor including a common gate, a logic device including the CMOS transistor, and a method of manufacturing the CMOS transistor.

2. Description of the Related Art

A CMOS transistor may include a PMOS transistor and an NMOS transistor installed together on a substrate to complement each other's functionality. Such a semiconductor device can be driven with low power and operate at relatively high speed.

A CMOS transistor typically uses a common gate. In other words, when either one of a PMOS transistor and an NMOS transistor is driven, a driving voltage is applied to gates of the two transistors. Accordingly, when one of the NMOS and PMOS transistors, for example, the NMOS transistor, is driven, the PMOS transistor may also be driven although it must be in an off state.

SUMMARY

Embodiments of the present invention provide a complementary metal oxide semiconductor (CMOS) thin film transistor capable of driving only one of a PMOS transistor and an NMOS transistor without driving the other.

Embodiments of the present invention also provide a logic device including the CMOS thin film transistor.

Embodiments of the present invention also provide a method of manufacturing the CMOS thin film transistor.

According to an embodiment of the present invention, a CMOS thin film transistor includes a base substrate and a semiconductor layer having a predetermined shape, formed on the base substrate. A P-channel transistor and an N-channel transistor that intersects the P-channel transistor and shares a gate with the P-channel transistor are formed on the semiconductor layer, and a Schottky barrier inducing material layer is formed on a source and a drain of one of the P-channel transistor and the N-channel transistor.

The Schottky barrier inducing material layer, as well as the gate, may be formed of platinum or erbium, for example.

According to another embodiment of the present invention, an inverter includes a CMOS thin film transistor comprising: a P-channel transistor; an N-channel transistor intersecting the P-channel transistor and sharing a gate with the P-channel transistor; a base substrate; and a semiconductor layer having a predetermined shape, formed on the base substrate. The P-channel transistor and the N-channel transistor are formed on the semiconductor layer, and a Schottky barrier inducing material layer is formed on a source and a drain of one of the P-channel transistor and the N-channel transistor.

According to another embodiment of the present invention, a NOR logic device includes two CMOS thin film transistors. Each of the CMOS thin film transistors may have the same structure as the inverter above.

According to another embodiment of the present invention, a NAND logic device includes two CMOS thin film transistors. Each of the CMOS thin film transistors may also have the same structure as the inverter above.

In the inverter, the NOR logic device, and the NAND logic device, the Schottky barrier inducing material layer and the gate may be formed of platinum or erbium, for example.

According to yet another embodiment of the present invention, a method of forming a CMOS thin film transistor comprises: forming a semiconductor layer on a base substrate; defining a first area where a P-channel transistor is formed and a second area where an N-channel transistor is formed, within the semiconductor layer; patterning the semiconductor layer to produce the first and second areas; and forming the P-channel transistor and the N-channel transistor on the first and second areas, respectively, forming a Schottky barrier inducing material layer on a source and a drain of one of the P-channel transistor and the N-channel transistor, and forming a common gate on an area where the P-channel and N-channel transistors intersect.

The Schottky barrier inducing material layer may be formed of platinum or erbium, for example. The gate may also be formed of platinum or erbium.

After the Schottky barrier inducing material layer is formed, the resulting structure may be annealed at a predetermined temperature.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
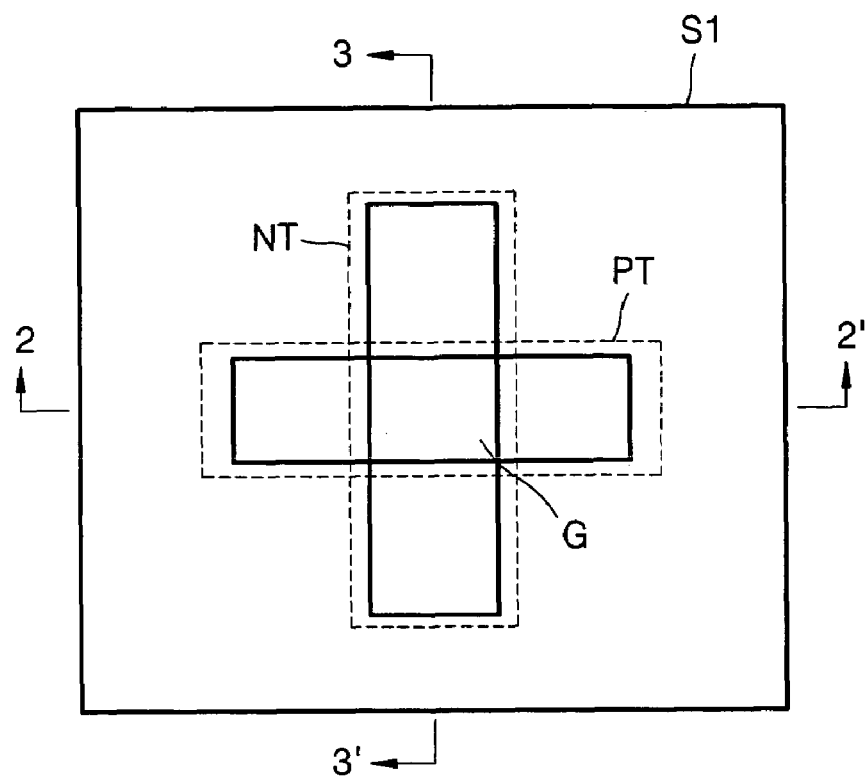
FIG. 1 is a plan view of a complementary metal oxide semiconductor (CMOS) thin film transistor including a common gate, according to an embodiment of the present invention.

Embodiments of the present invention will now be described more fully with reference to the accompanying drawings, in which exemplary embodiments of the invention are shown. In the drawings, the thicknesses of layers and regions may be exaggerated for clarity. The figure to the right of some of the drawings is a right side view of the figure that is to the left thereof.

Referring to FIG. 1, a P-channel transistor, namely, a PMOS transistor (PT), is installed on a base substrate S1, and an N-channel transistor, namely, an NMOS transistor (NT), is also installed on the base substrate S1 to be orthogonal to the PMOS transistor PT. A common gate exists at an intersection of the PMOS transistor PT and the NMOS transistor NT. The PMOS transistor PT and the NMOS transistor NT are formed in a single body. For example, the PMOS transistor PT and the NMOS transistor NT are formed in a single silicon layer having a predetermined thickness.

Figure 2:
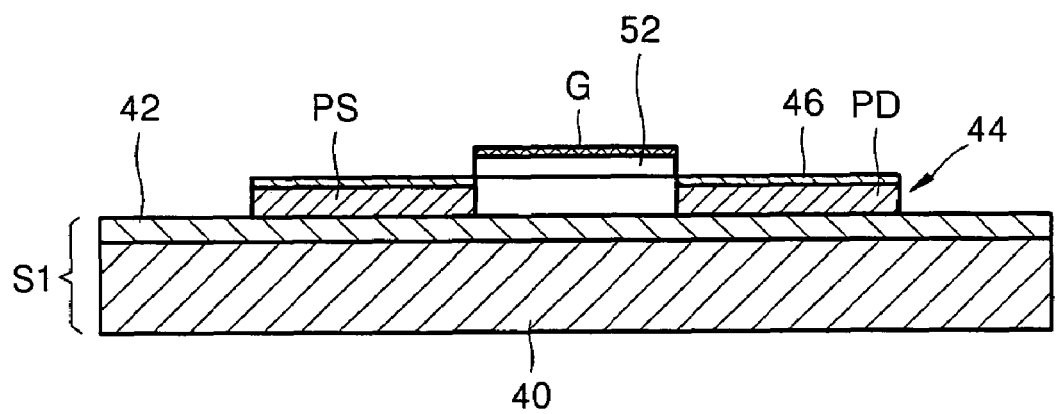
FIG. 2 is a cross-section taken along line 2-2' of FIG. 1.

FIG. 2 is a cross-section taken along line 2-2' of FIG. 1. Referring to FIG. 2, the base substrate S1 is a silicon-on-insulator (SOI) substrate obtained by sequentially stacking a semiconductor substrate 40 and an oxide film 42. The oxide film 42 may be a silicon oxide film. A semiconductor layer such as a silicon layer 44 is placed on the oxide film 42. The silicon layer 44 includes a source PS doped with p-type impurities and a drain PD doped with p-type impurities. A channel is formed between the source PS and the drain PD. A Schottky barrier inducing material layer 46 is placed on surfaces of the source PS and the drain PD. For example, the material layer 46 may be a platinum (Pt) layer or an erbium (Er) layer having a thickness of about 200 Å.

A Schottky barrier inducing material layer 46 may instead be placed on surfaces of a source and a drain of the NMOS transistor NT. A Schottky barrier inducing material layer, however, is preferably not simultaneously formed on the source and drain of both the PMOS and the NMOS transistors. In any case, for the sake of clarity, this description will continue only with the example of the Schottky barrier inducing material layer 46 being placed on surfaces of the source PS and the drain PD.

Continuing, a gate insulating film 52 and the common gate G are sequentially stacked on the silicon layer 44 between the source PS and the drain PD. The gate insulating film 52 may be a silicon oxide film or other known suitable gate dielectric films. The common gate G may be a Pt or Er layer having a predetermined thickness of, for example, about 200 Å.

Figure 3:
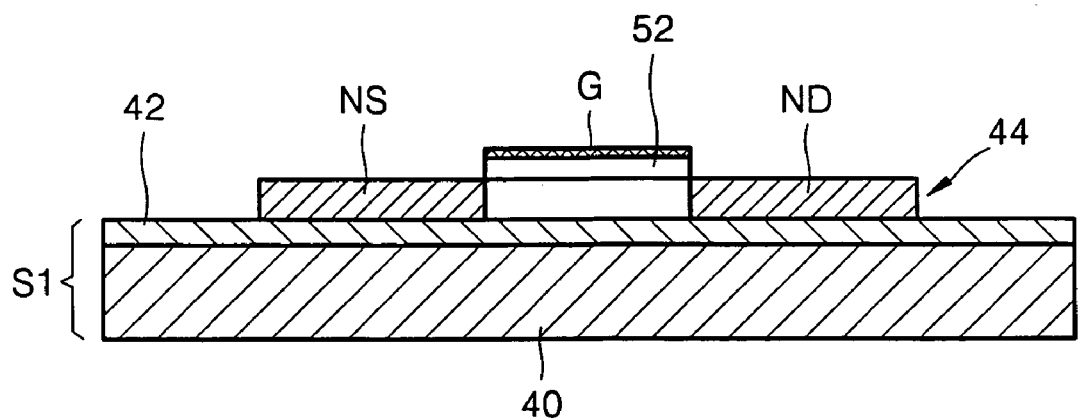
FIG. 3 is a cross-section taken along line 3-3' of FIG. 1.

FIG. 3 is a cross-section taken along line 3-3' of FIG. 1. Referring to FIG. 3, a portion of the silicon layer 44 that is used as the NMOS transistor NT includes a source NS and a drain ND, each of which is doped with n-type impurities. The silicon layer 44 between the source NS and the drain ND is used as a channel.

Because the Schottky barrier inducing material layer 46 is placed on the surfaces of the source PS and the drain PD of the PMOS transistor PT as described above, a positive threshold voltage of the PMOS transistor PT is higher than a positive threshold voltage of the NMOS transistor NT in the CMOS transistor of FIG. 1. In other words, a difference of threshold voltages between the PMOS and NMOS transistors is caused by a shift in the threshold voltage of the PMOS transistor PT due to the Schottky barrier inducing material layer 46 on its source and drain.

It should be noted that, although the present description is based on the Schottky barrier inducing material layer 46 on the source and drain of the PMOS transistor, the same type of threshold shift of the NMOS transistor would occur if the Schottky barrier inducing material layer 46 were on its source and drain.

In either case then, the use of the CMOS transistor can solve a conventional problem in that when the NMOS transistor is driven, the PMOS transistor is driven as well.

Various examples in which the CMOS transistor of FIG. 1 is applied will now be described.

Figure 4:
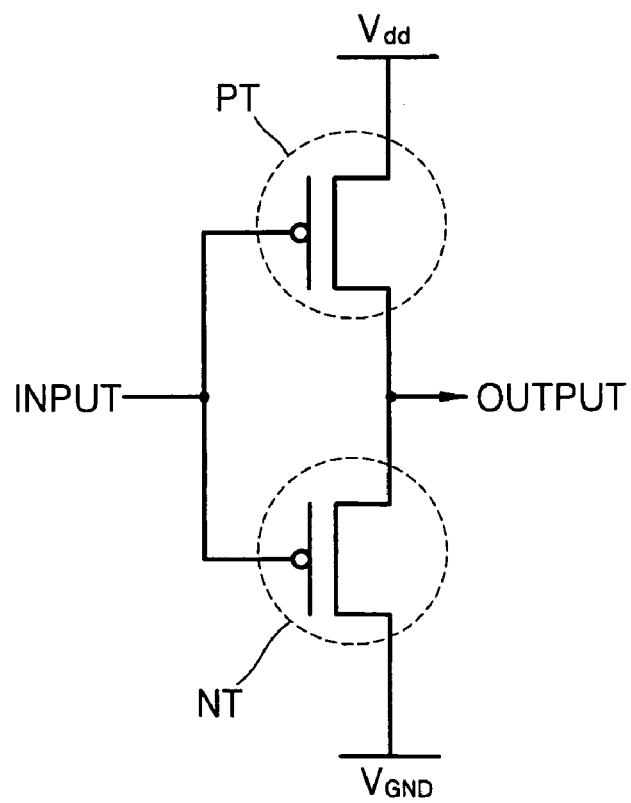
FIG. 4 is a circuit diagram of an inverter.
Figure 5:
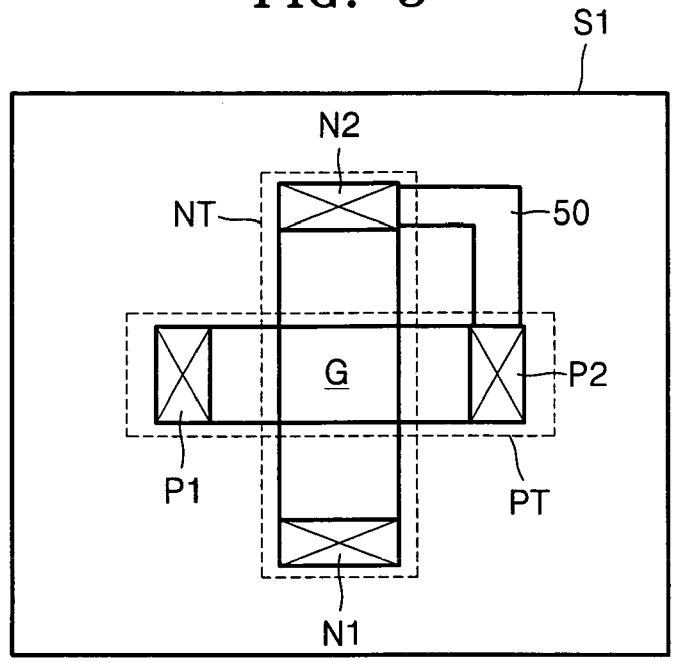
FIG. 5 is a plan view of an embodiment in which the inverter of FIG. 4 is formed with the CMOS transistor of FIG. 1.

FIG. 4 is a circuit diagram of an inverter that includes a single PMOS transistor PT and a single NMOS transistor NT. FIG. 5 illustrates an embodiment in which the inverter of FIG. 4 includes the CMOS transistor of FIG. 1.

Referring to FIG. 5, a contact pad P2 connected to the drain PD (not shown) of the PMOS transistor PT is connected to a contact pad N2 connected to the drain ND (not shown) of the NMOS transistor NT via a conductive wiring 50. The conductive wiring 50 is connected to an output, which may be an external sensing unit (not shown). A power supply voltage Vdd is applied to the source PS of the PMOS transistor PT via the contact pad P1. A ground voltage VGND is applied to the source NS of the NMOS transistor NT. The PMOS transistor PT having a source and a drain, each doped with a Schottky barrier inducing material, has a Schottky barrier. When a platinum (Pt) is used as the Schottky barrier inducing material and a channel between the source and the drain is doped with p-type impurities, a threshold voltage of the PMOS transistor PT increases up to about 0.9V. Thus, when a predetermined voltage (e.g., 0.7V) higher than a threshold voltage (e.g., 0.5V) of the NMOS transistor NT, but lower than a threshold voltage (e.g., 0.9V) of the PMOS transistor PT, is applied as an input voltage to the common gate G of the inverter of FIG. 5, the NMOS transistor NT is turned on, but the PMOS transistor PT is still turned off. Hence, the ground voltage VGND is applied to the output.

Meanwhile, when a negative voltage (e.g., −1V) is applied to the common gate G, the NMOS transistor NT is turned off, but the PMOS transistor PT is turned on. Accordingly, the inverter of FIG. 5 outputs the power supply voltage Vdd.

Figure 6:
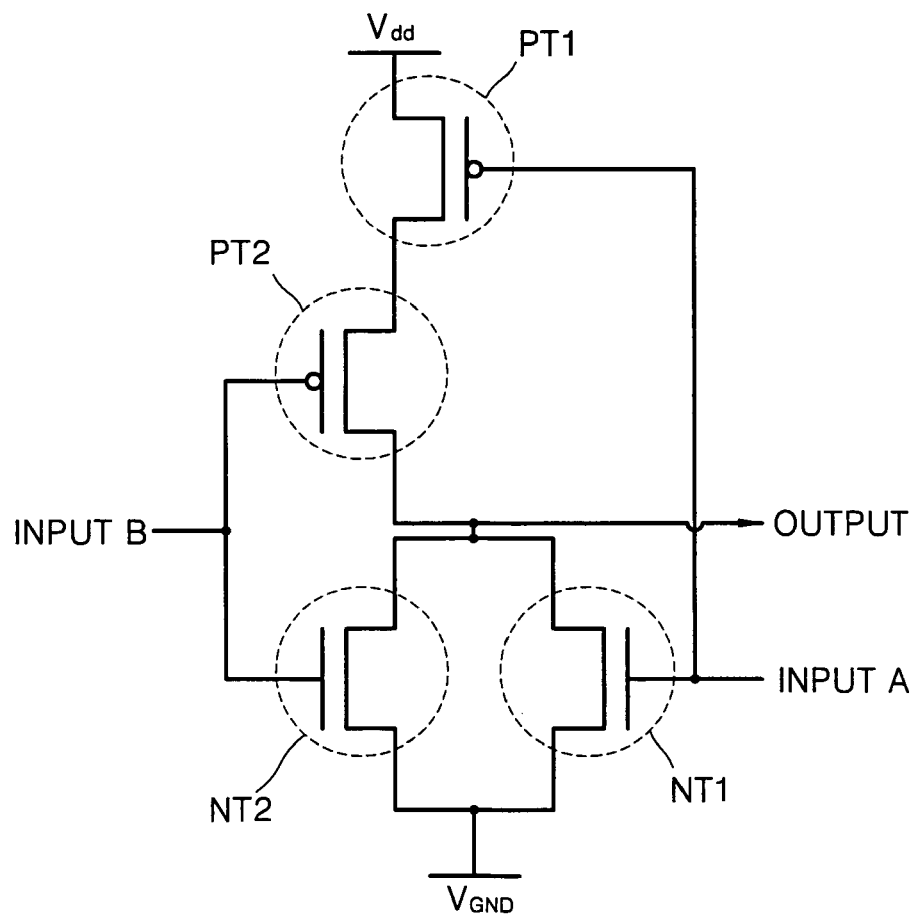
FIG. 6 is a circuit diagram of a NOR gate.
Figure 7:
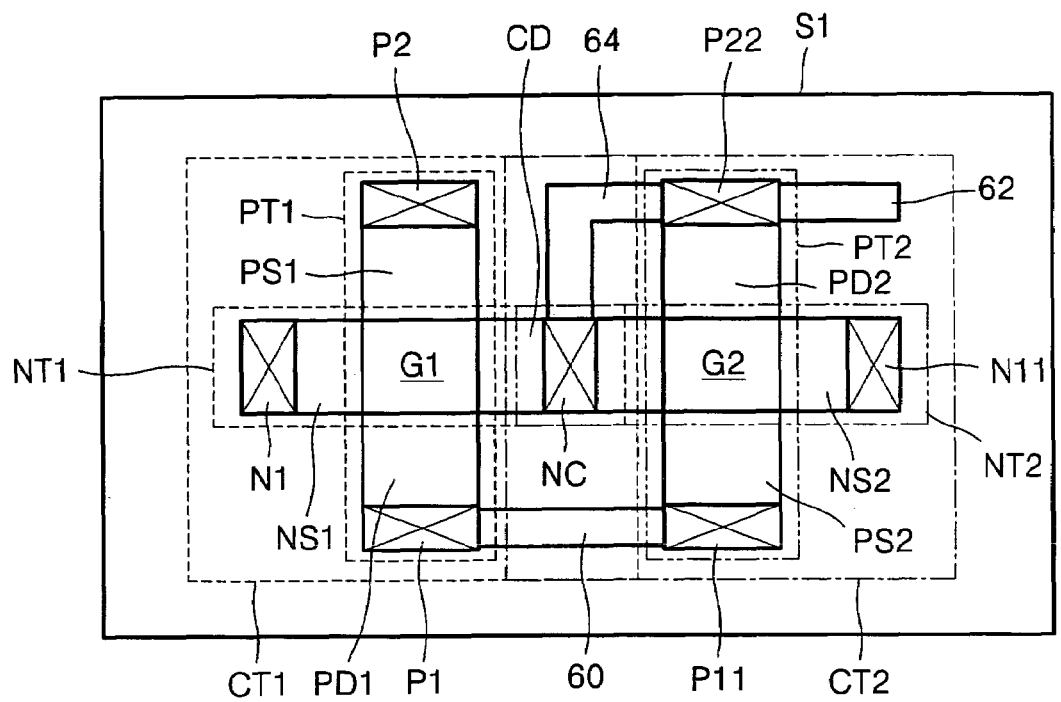
FIG. 7 is a plan view of an embodiment in which the NOR gate of FIG. 6 is formed with the CMOS transistor of FIG. 1.

FIG. 6 is a circuit diagram of a NOR gate. Referring to FIG. 6, the NOR gate includes first and second PMOS transistors PT1 and PT2 and first and second NMOS transistors NT1 and NT2. FIG. 7 illustrates an embodiment in which the NOR gate of FIG. 6 includes two CMOS transistors like those shown in FIG. 1. In FIG. 7, reference characters CT1 and CT2 indicate first and second CMOS transistors, respectively.

Referring to FIG. 7, Vdd is connected to a source PS1 of a first PMOS transistor PT1 included in the first CMOS transistor CT1 via a contact path P2. A contact pad P1 connected to a drain PD1 of the first PMOS transistor PT1 is coupled to a contact pad P11 connected to a source PS2 of a second PMOS transistor PT2 included in the second CMOS transistor CT2 via a conductive wiring 60. A ground voltage VGND is applied to a contact pad N1 connected to a source NS1 of a first NMOS transistor NT1 included in the first CMOS transistor CT1 and a contact pad N11 connected to a source NS2 of a second NMOS transistor NT2 included in the second CMOS transistor CT2. A contact pad NC connected to a common drain CD of the first and second NMOS transistors NT1 and NT2 is coupled to a contact pad P22 connected to a drain PD2 of the second PMOS transistor PT2 via a conductive wiring 64. The contact pad P22 connected to the drain PD2 of the second PMOS transistor PT2 is also coupled to an external sensor (not shown) via another conductive wiring 62.

In this structure, when inputs A and B are applied to a gate G1 of the first CMOS transistor CT1 and a gate G2 of the second CMOS transistor CT2, respectively, output via the conductive wiring 62 satisfies a NOR operation of the inputs A and B.

Figure 8:
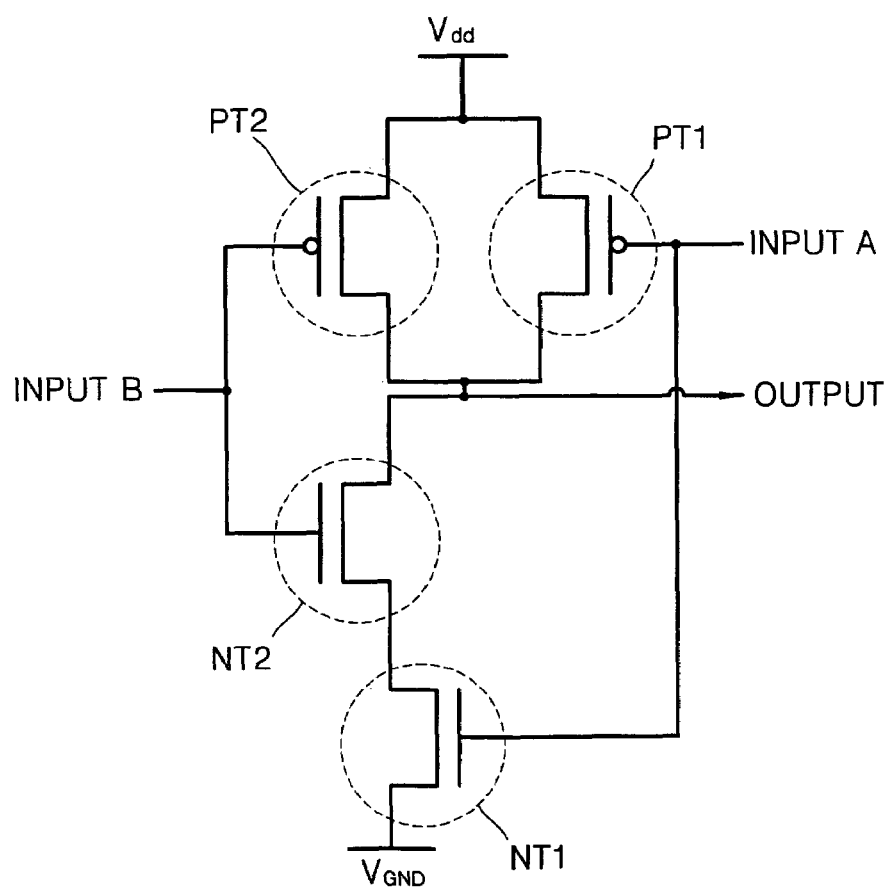
FIG. 8 is a circuit diagram of a NAND gate.
Figure 9:
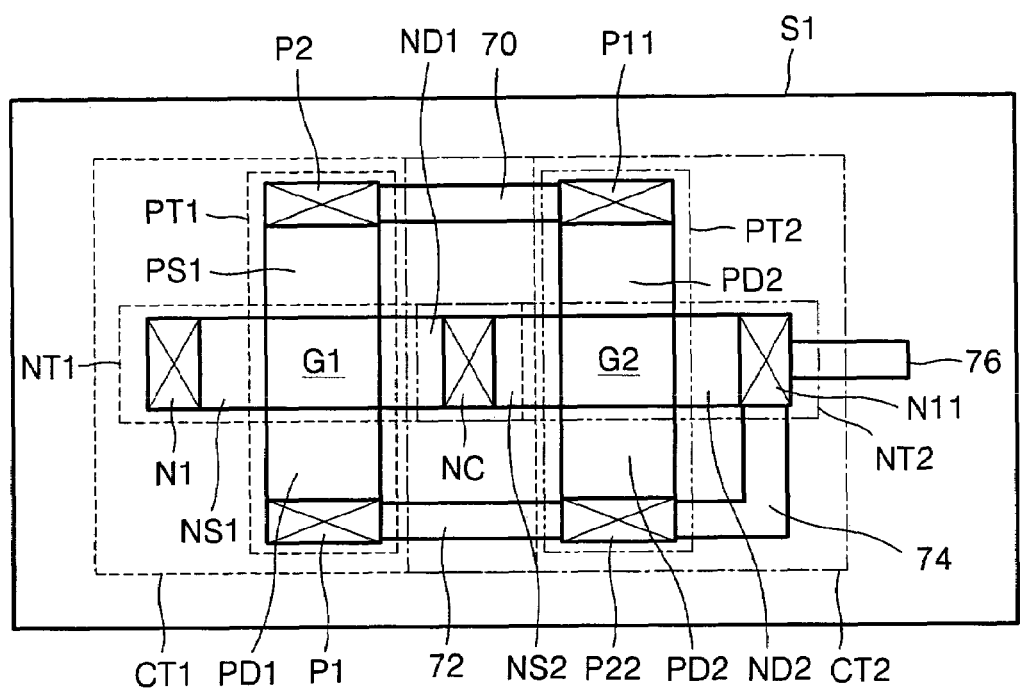
FIG. 9 is a plan view of an embodiment in which the NAND gate of FIG. 8 is formed with the CMOS transistor of FIG. 1.

FIG. 8 is a circuit diagram of a NAND gate. FIG. 9 is a plan view of an embodiment in which the NAND gate of FIG. 8 includes two CMOS transistors like those of FIG. 1.

Referring to FIG. 9, a contact pad P2 connected to a source PS1 of a first PMOS transistor PT1 is coupled to a contact pad P11 connected to a source PS2 of a second PMOS transistor PT2 via a conductive wiring 70. Power supply voltage Vdd is applied to the source PS1 of the first PMOS transistor PT1 and the source PS2 of the second PMOS transistor PT2 via the conductive wiring 70. A ground voltage VGND is applied to a contact pad N1 connected to a source NS1 of a first NMOS transistor NT1. A contact pad P1 connected to a drain PD1 of the first PMOS transistor PT1 is coupled to a contact pad P22 connected to a drain PD2 of the second PMOS transistor PT2 via a conductive wiring 72. The contact pad P22 connected to the drain PD2 of the second PMOS transistors PT2 is coupled to a contact pad N11 connected to a drain ND2 of a second NMOS transistor NT2 via a conductive wiring 74. The drain ND2 of the second NMOS transistor NT2 is connected to an external sensor (not shown) via another conductive wiring 76. In this structure, when inputs A and B are applied to a gate G1 of a first CMOS transistor CT1 and a gate G2 of a second CMOS transistor CT2, respectively, the output from the drain ND2 of the second NMOS transistor NT2 satisfies a NAND operation of the inputs A and B.

An embodiment of a method of manufacturing the CMOS transistor of FIG. 1 will now be described.

Figure 10:
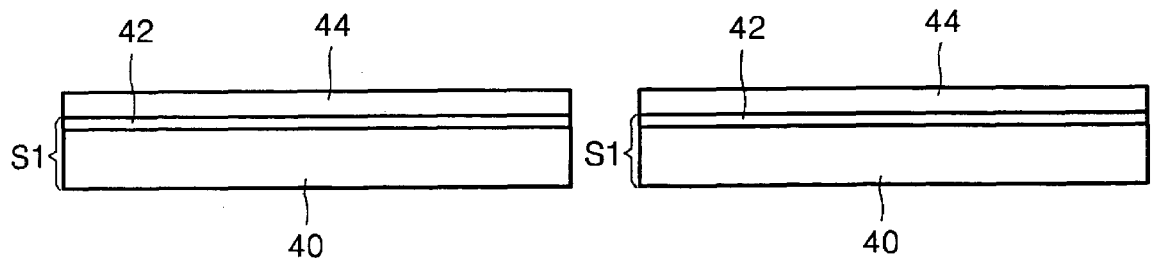
FIGS. 10 through 18 are cross-sectional views illustrating a method of manufacturing the CMOS transistor of FIG. 1.

In FIG. 10, the left cross-section is taken along line 2-2' of FIG. 1, and the right cross-section is taken along line 3-3' of FIG. 1.

Referring to FIG. 10, first, a semiconductor layer such as a silicon layer 44 is formed on a base substrate S1. The base substrate S1 is formed by sequentially stacking a semiconductor substrate 40 and an insulating layer such as an oxide film 42. The semiconductor substrate 40 may be an N-type or P-type silicon substrate with a thickness of about 500 Å. The oxide film 42 may be a silicon oxide film. The silicon layer 44 may be formed to a thickness of about 2000 nm (2 μm). The base substrate S1 may be a single semiconductor substrate, e.g., a bulk silicon substrate.

Then the silicon layer 44 is patterned using an electron beam having a predetermined width (e.g., 100 nm) and a predetermined length, both of which are suitable to form a MOS transistor.

Figure 11:
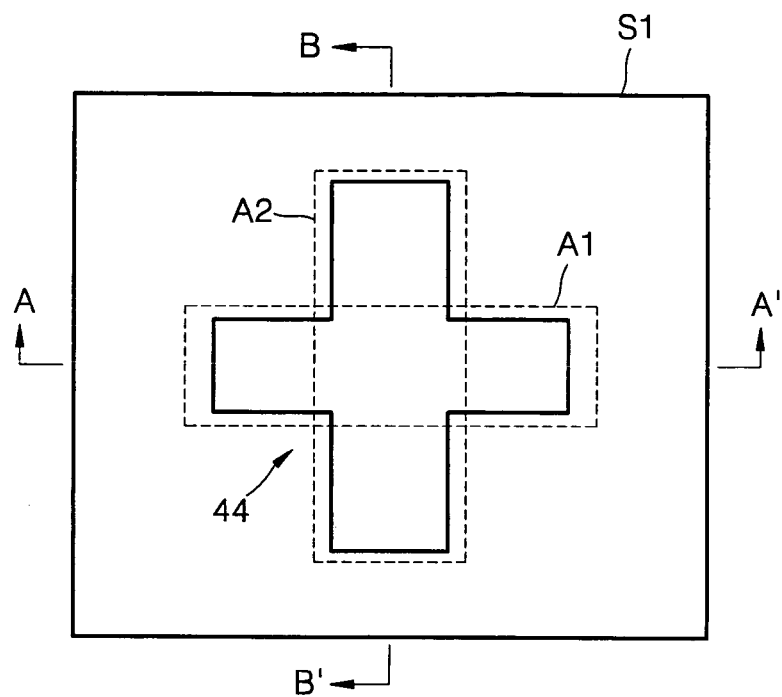

FIG. 11 is a plan view of the patterned silicon layer 44.

In FIG. 11, reference characters A1 and A2 indicate an area where a PMOS transistor is formed and an area where an NMOS transistor is formed, respectively. Hereinafter, the area where the PMOS transistor is formed will be referred to as the first area, and the area where the NMOS transistor is formed will be referred to as the second area. Of course, reference character A1 may be the second area, and reference character A2 may be the first area.

Figure 12:
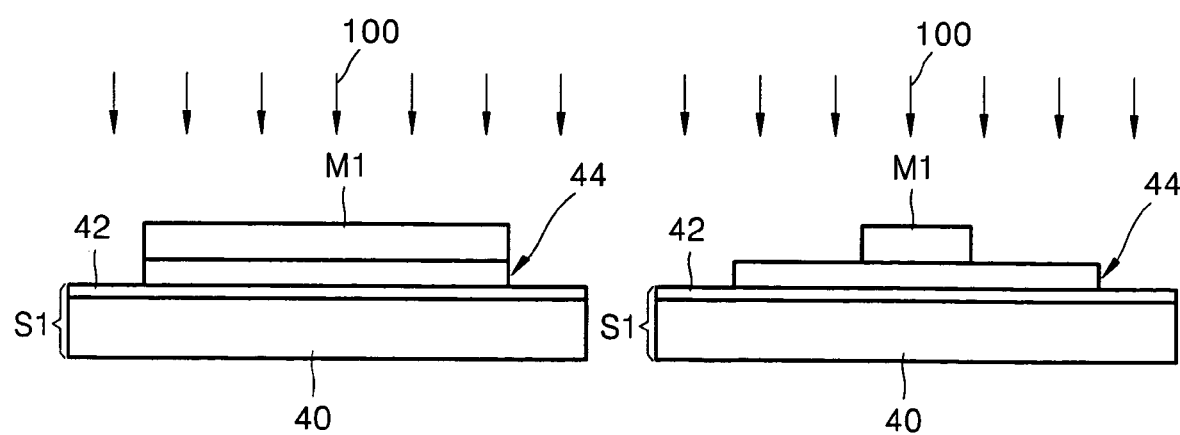

In FIG. 12 and the following figures, the left cross-sections are taken along line A-A' of FIG. 11, and the right cross-sections are taken along line B-B' of FIG. 11.

Figure 13:
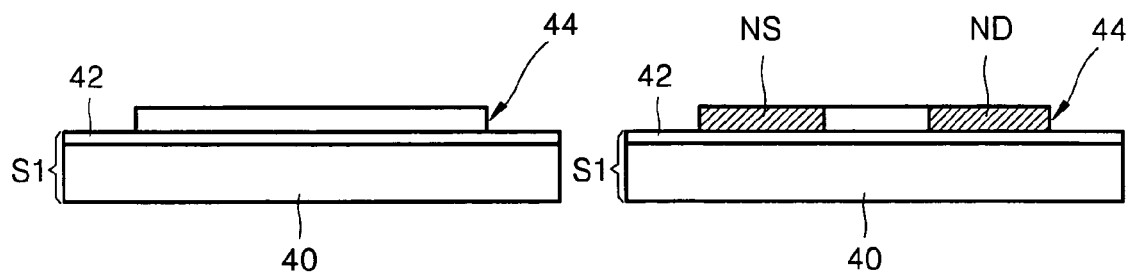

Referring to FIG. 12, a mask M1, with which the first area A1 is covered, is formed on the silicon layer 44. Then, N+ impurities 100 are ion-implanted into substantially the entire surface of the silicon layer 44. Thereafter, the mask M1 is removed. As a result, as shown in FIG. 13, the N+ impurities 100 exist on a portion of the second area A2 of the silicon layer 44 that is not covered with the mask M1, so that a source NS and a drain ND are formed on the silicon layer 44.

Figure 14:
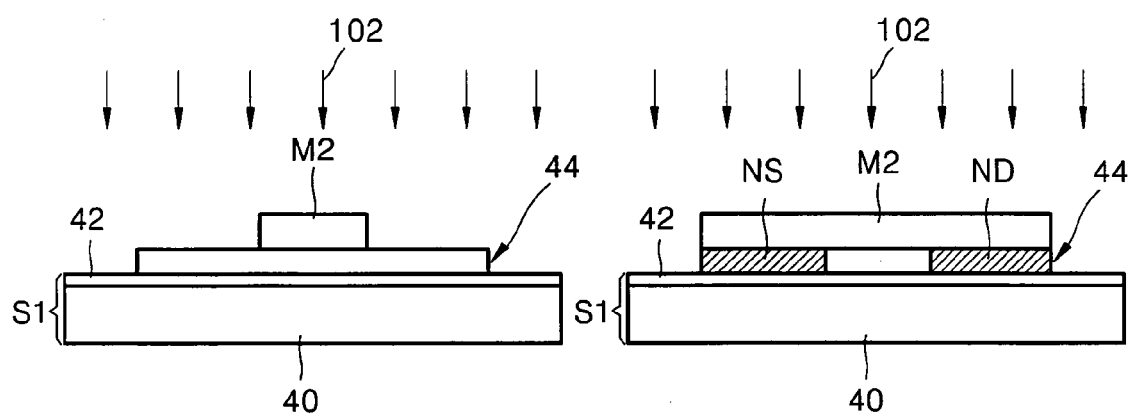
Figure 15:
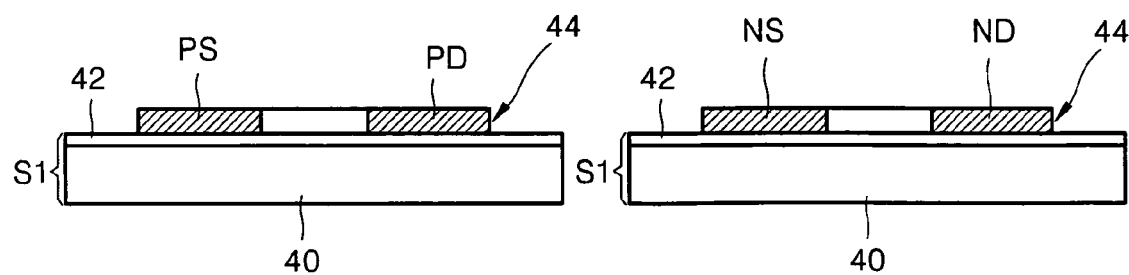

Next, referring to FIG. 14, a mask M2, with which the second area A2 is covered, is formed on the silicon layer 44. Then, P+ impurities 102 are ion-implanted into the entire surface of the silicon layer 44. Thereafter, the mask M2 is removed. As a result, as shown in FIG. 15, a source PS and a drain PD, doped with P+ impurities, are formed on the first area A1 of the silicon layer 44 at a predetermined interval.

Thereafter, P+ doping for forming a channel on the area of the silicon layer 44 between the source PS and the drain PD is performed.

Figure 16:
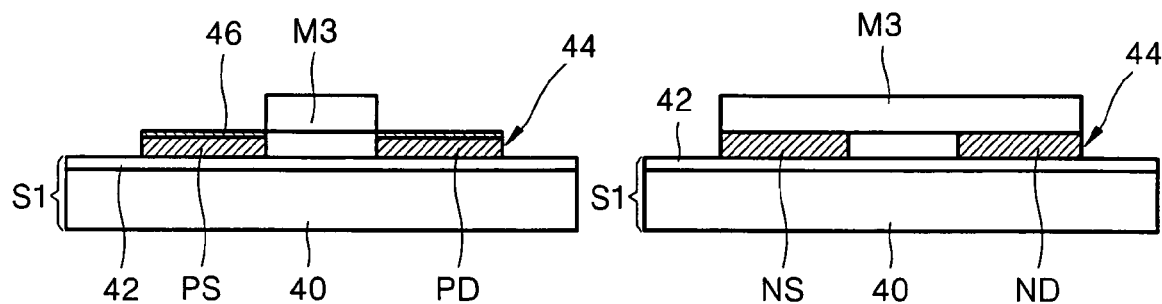

Then, as shown in FIG. 16, the second area A2 of the silicon layer 44 is covered with a mask M3. As shown in FIG. 11, the first and second areas A1 and A2 intersect each other and share the overlapped portion. Hence, the mask M3 also covers the portion of the first area A1 of the silicon layer 44 that is shared by the second area A2, that is, the portion of the first area A1 on which a gate is formed. Accordingly, after the mask M3 is formed, only the source PS and the drain PD of the first area A1 of the silicon layer 44 are exposed. After the formation of the mask M3, a Schottky barrier inducing material layer 46 is formed on the source PS and drain PD of the first area A1. The Schottky barrier inducing material layer 46 may be formed of a predetermined material capable of forming a Schottky barrier, for example, platinum (Pt) or erbium (Er), using a deposition method, for example, a sputtering method. The Schottky barrier inducing material layer 46 may be about 200 Å thick. After the formation of the Schottky barrier inducing material layer 46 as described above, the resultant structure is annealed at a predetermined temperature, for example, 500° C., for a predetermined period of time. Thereafter, the mask M3 is removed. In some cases, the mask M3 may be removed before the annealing.

Figure 17:
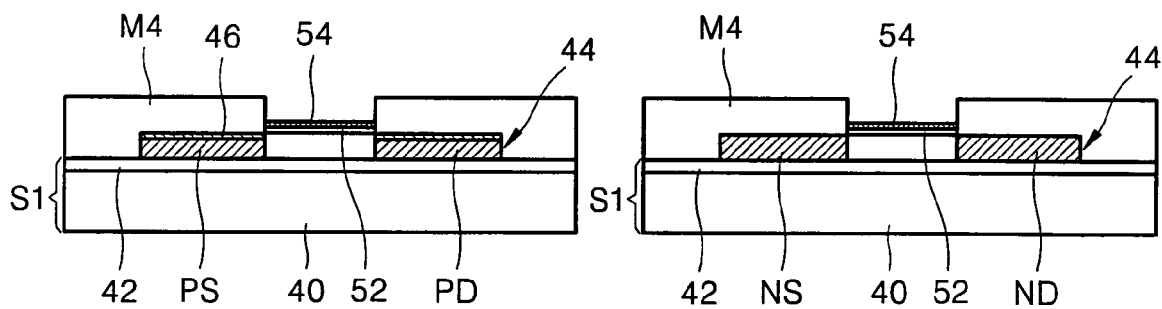
Figure 18:
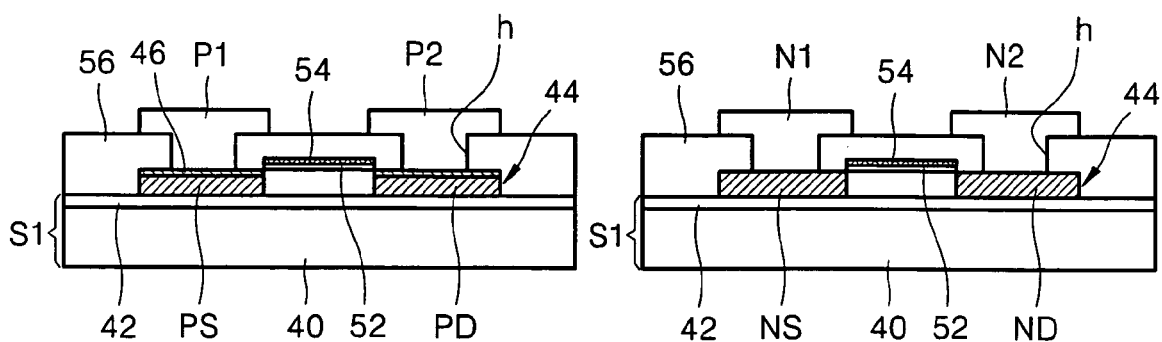

Referring to FIG. 17, after the removal of the mask M3, a gate insulative film 52 is formed on the overlapped portion of the first and second areas A1 and A2 of the silicon layer 44, that is, on the portion where a gate is formed. The gate insulative film 52 may be a silicon oxide film. Then, a mask M4 that exposes only the gate insulative film 52 is formed on the base substrate S1 according to a photolithographic process using an electron beam. A gate G is formed by stacking a predetermined conductive material, for example, Pt or Er, on the exposed gate insulative film 52. The gate G may have a thickness of about 200 Å. To form the gate G, Pt or Er may be stacked by, for example, sputtering. After the formation of the gate G of Pt or Er as described above, the base substrate S1 is annealed at a predetermined temperature, for example, 500° C., for a predetermined period of time. Then, the mask M4 is removed. However, the removal of the mask M4 may occur before the annealing. Consequently, a PMOS thin film transistor having a Schottky barrier is formed on the first area A1 of the silicon layer 44, and an NMOS thin film transistor is formed on the second area A2 of the silicon layer 44.

After the annealing and the removal of the mask M4, an interlayer insulative layer 56, with which the silicon layer 44 and a stack formed thereon are covered, is formed on the base substrate S1. Via holes h are formed in the interlayer insulative layer 56 to expose the source PS and drain PD of the first area A1 and the source NS and drain ND of the second area A2. Then, contact pads P1 and P2 connected to the source PS and drain PD, respectively, of the first area A1, through via holes h, and contact pads N1 and N2 connected to the source NS and drain ND, respectively, of the second area A2, through via holes h, are formed on the interlayer insulative layer 56. The contact pads P1, P2, N1 and N2 may be formed of aluminum to a thickness of about 1000 Å. The resultant structure may be annealed at 450° C. in a hydrogen atmosphere.

Thereafter, a contact pad connected to the gate G may be formed separately from the contact pads P1, P2, N1 and N2.

According to an aspect of the present invention, as described above, a PMOS transistor and an NMOS transistor are formed on a single silicon layer to intersect each other, and a common gate is formed on the intersection area. In addition, a Schottky barrier inducing material layer is formed on a source and a drain of the PMOS transistor. Just as well, a Schottky barrier inducing material layer may be formed on a source and a drain of the NMOS transistor instead.

Accordingly, a positive threshold voltage of the PMOS transistor becomes higher than a threshold voltage of the NMOS transistor, so that the PMOS transistor is prevented from being driven together when the NMOS transistor is driven. This leads to increases of not only the reliability of a CMOS transistor according to some embodiments of the present invention, but also the reliability of a logic device that uses the CMOS transistor, for example, a NOT gate, a NOR gate, or a NAND gate. Furthermore, the logic device can be embodied with one or two CMOS transistors, thereby increasing the integration of the logic device.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, a single semiconductor substrate instead of the SOI substrate may be used as the base substrate S1, and a typical transistor instead of a thin film transistor may be formed on the general semiconductor substrate. In addition, materials other than Pt and Er may be used to form a Schottky barrier inducing material layer.

What is claimed is:

1. A complementary metal oxide semiconductor (CMOS) thin film transistor comprising:
    a base substrate;
    a semiconductor layer formed on the base substrate;
    a P-channel transistor formed on the semiconductor layer;
    an N-channel transistor that intersects the P-channel transistor, the N-channel and the P-channel transistor having a common gate, the N-channel transistor formed on the semiconductor layer; and
    a Schottky barrier inducing material layer formed on surfaces of a source and a drain of one of the P-channel transistor and the N-channel transistor.

2. The CMOS thin film transistor of claim 1, wherein the Schottky barrier inducing material layer is formed of one of platinum and erbium.

3. The CMOS thin film transistor of claim 1, wherein the gate is formed of one of platinum and erbium.

4. The CMOS thin film transistor of claim 1, wherein the base substrate comprises an SOI substrate or a single semiconductor substrate.

5. The CMOS thin film transistor of claim 1, wherein a channel length of one of the P-channel transistor and the N-channel transistor is equal to a width of the other of the P-channel transistor and the N-channel transistor.

6. An inverter comprising:
    a CMOS thin film transistor, comprising:
    a P-channel transistor;
    an N-channel transistor intersecting the P-channel transistor, the N-channel and the P-channel transistor having a common gate;
    a base substrate; and
    a semiconductor layer formed on the base substrate,
    wherein the P-channel transistor and the N-channel transistor are formed on the semiconductor layer, and a Schottky barrier inducing material layer is formed on surfaces of a source and a drain of one of the P-channel transistor and the N-channel transistor.

7. The inverter of claim 6, wherein the Schottky barrier inducing material layer is formed of one of platinum and erbium.

8. The inverter of claim 6, wherein the gate is formed of one of platinum and erbium.

9. The inverter of claim 6, wherein the P-channel transistor comprises a source and a drain doped with p-type impurities.

10. The inverter of claim 6, further comprising a conductive wiring connecting a drain of the P-channel transistor to a drain of the N-channel transistor.

11. A NOR logic device comprising:
    two CMOS thin film transistors, each of the CMOS thin film transistors comprising:
    a P-channel transistor;
    an N-channel transistor intersecting the P-channel transistor, the N-channel and the P-channel transistor having a common gate;
    a base substrate; and
    a semiconductor layer formed on the base substrate,
    wherein the P-channel transistor and the N-channel transistor are formed on the semiconductor layer, and a Schottky barrier inducing material layer is formed on surfaces of a source and a drain of one of the P-channel transistor and the N-channel transistor.

12. The NOR logic device of claim 11, wherein the Schottky barrier inducing material layer is formed of one of platinum and erbium.

13. The NOR logic device of claim 11, wherein the gate is formed of one of platinum and erbium.

14. The NOR logic device of claim 11, further comprising:
    a first conductive wiring connecting a drain of the P-channel transistor of a first one of the two CMOS thin film transistors to a source of the P-channel transistor of a second one of the two CMOS thin film transistors; and
    a second conductive wiring connecting a drain of the P-channel transistor of the second one of the two CMOS thin film transistors to drains of the N-channel transistors of the first and second ones of the two CMOS thin film transistors.

15. A NAND logic device comprising:
    two CMOS thin film transistors, each of the CMOS thin film transistors comprising:
    a P-channel transistor;
    an N-channel transistor intersecting the P-channel transistor, the N-channel and the P-channel transistor having a common gate;
    a base substrate; and
    a semiconductor layer formed on the base substrate,
    wherein the P-channel transistor and the N-channel transistor are formed on the semiconductor layer, and a Schottky barrier inducing material layer is formed on surfaces of a source and a drain of one of the P-channel transistor and the N-channel transistor.

16. The NAND logic device of claim 15, wherein the Schottky barrier inducing material layer is formed of one of platinum and erbium.

17. The NAND logic device of claim 15, wherein the gate is formed of one of platinum and erbium.

18. The NAND logic device of claim 15, further comprising:
    a first conductive wiring connecting a source of the P-channel transistor of a first one of the two CMOS thin film transistors to a drain of the P-channel transistor of a second one of the two CMOS thin film transistors;
    a second conductive wiring connecting a drain of the P-channel transistor of the first one of the two CMOS thin film transistors to a drain of the P-channel transistor of the second one of the two CMOS thin film transistors; and a third conductive wiring connecting the drain of the P-channel transistor of the second one of the two CMOS thin film transistors to a drain of the N-channel transistor of one of the first and second ones of the two CMOS thin film transistors.

19. A method of forming a semiconductor device, the method comprising:

forming a semiconductor layer on a base substrate;

defining a first area where a P-channel transistor is formed and a second area where an N-channel transistor is formed, within the semiconductor layer;

patterning the semiconductor layer to produce the first and second areas;

forming the P-channel transistor and the N-channel transistor on the first and second areas, respectively;

forming a Schottky barrier inducing material layer on surfaces of a source and a drain of one of the P-channel transistor and the N-channel transistor; and forming a common gate on an area where the P-channel and N-channel transistors intersect.

20. The method of claim 19, wherein the Schottky barrier inducing material layer is formed of one of platinum and erbium.

21. The method of claim 19, wherein the gate is formed of one of platinum and erbium.

22. The method of claim 19, wherein after the Schottky barrier inducing material layer is formed, annealing a resultant structure.

23. The method of claim 19, wherein the semiconductor device is a CMOS thin film transistor.

24. The method of claim 19, further comprising assembling the semiconductor device into an inverter.

25. The method of claim 19, further comprising assembling the semiconductor device into a NOR logic device.

26. The method of claim 19, further comprising assembling the semiconductor device into a NAND logic device.

* * * * *